United States Patent
Halliyal et al.

(10) Patent No.: US 6,815,229 B1
(45) Date of Patent: Nov. 9, 2004

(54) IN SITU MONITORING OF SHEET RESISTIVITY OF SILICIDES DURING RAPID THERMAL ANNEALING USING ELECTRICAL METHODS

(75) Inventors: Arvind Halliyal, Cupertino, CA (US); Ramkumar Subramanian, Sunnyvale, CA (US); Bhanwar Singh, Morgan Hill, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 242 days.

(21) Appl. No.: 09/804,283

(22) Filed: Mar. 12, 2001

(51) Int. Cl.[7] .......................... H01L 21/66; H05K 7/20; G01R 27/08
(52) U.S. Cl. .......................... 438/14; 438/16; 438/664; 438/424; 438/541; 438/783; 438/560; 361/719; 361/234; 361/230; 324/715
(58) Field of Search .......................... 438/14, 16, 664, 438/424, 541, 783, 560, 677, 655, 627, 17, 488, 683, 934; 361/719, 234, 230; 324/715

(56) References Cited

U.S. PATENT DOCUMENTS

| | | | | |
|---|---|---|---|---|
| 5,270,222 A | * | 12/1993 | Moslehi | 438/7 |
| 5,400,209 A | * | 3/1995 | Moslehi | 361/234 |
| 5,466,484 A | * | 11/1995 | Spraggins et al. | 438/385 |
| 5,686,359 A | * | 11/1997 | Meester et al. | 438/664 |
| 5,756,369 A | * | 5/1998 | Aronowitz | 438/16 |
| 6,166,354 A | * | 12/2000 | Hause et al. | 438/14 |

* cited by examiner

*Primary Examiner*—Matthew Smith
*Assistant Examiner*—Igwe U. Anya
(74) *Attorney, Agent, or Firm*—Amin & Turocy, LLP

(57) ABSTRACT

A system and method for analyzing sheet resistivity of a layer on a wafer employing electrical methods and for controlling rapid thermal annealing (RTA) of the layer is provided. The system includes components for performing RTA on the layer and components for analyzing the sheet resistivity of one or more portions of the layer upon which RTA was performed. The system further includes a feedback generator adapted to accept sheet resistivity data and to produce feedback information that can be used to control the RTA components. The system further includes a data store that can be employed in machine learning and/or to facilitate generating feedback information that can be employed to control RTA and a monitoring application that can be employed to schedule maintenance on the various components in the system.

22 Claims, 10 Drawing Sheets

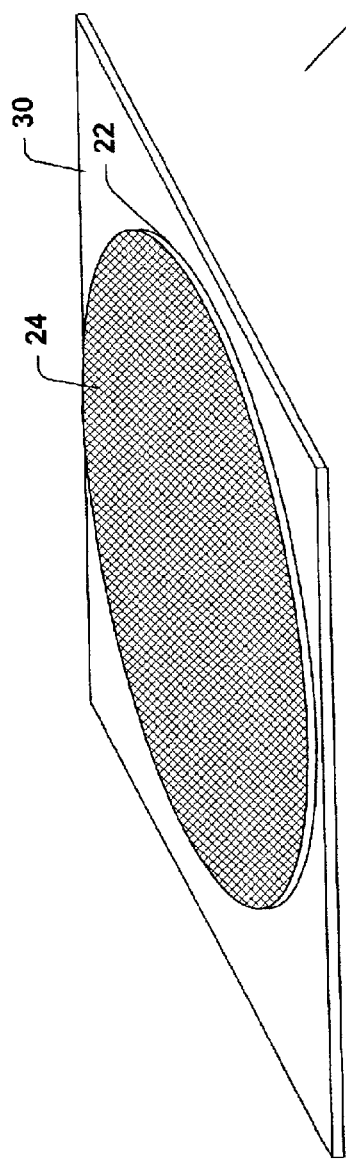
Fig. 6
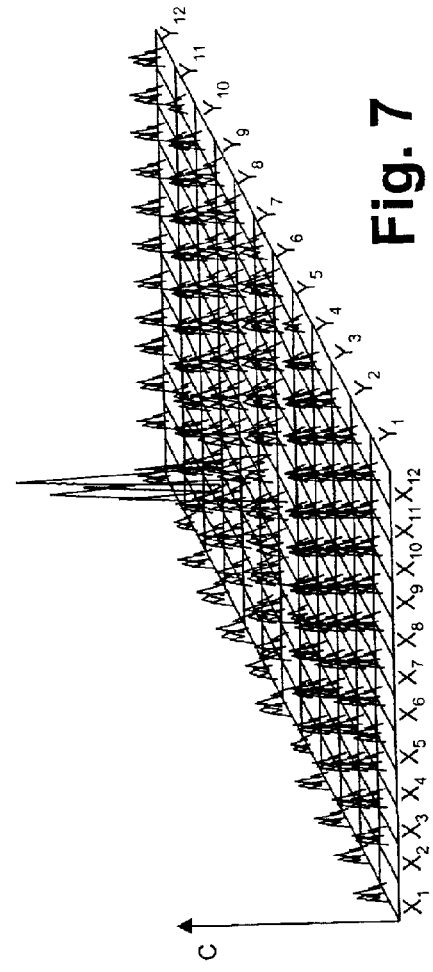
Fig. 8
Fig. 7

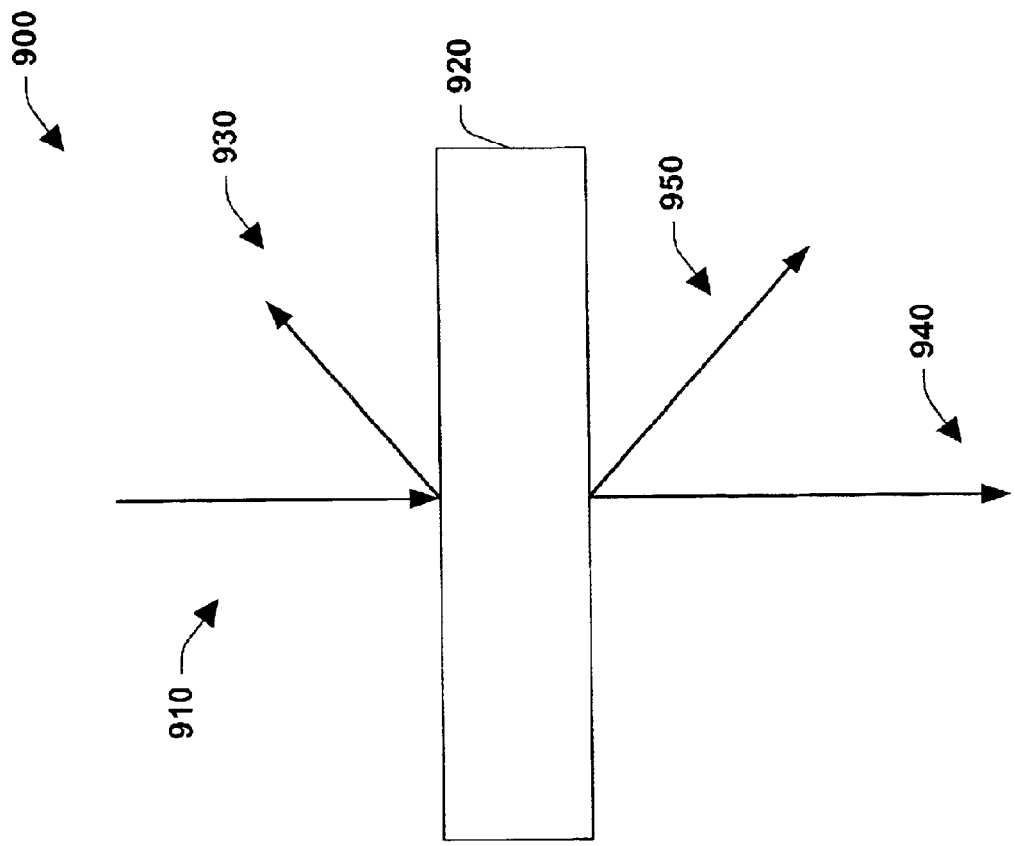

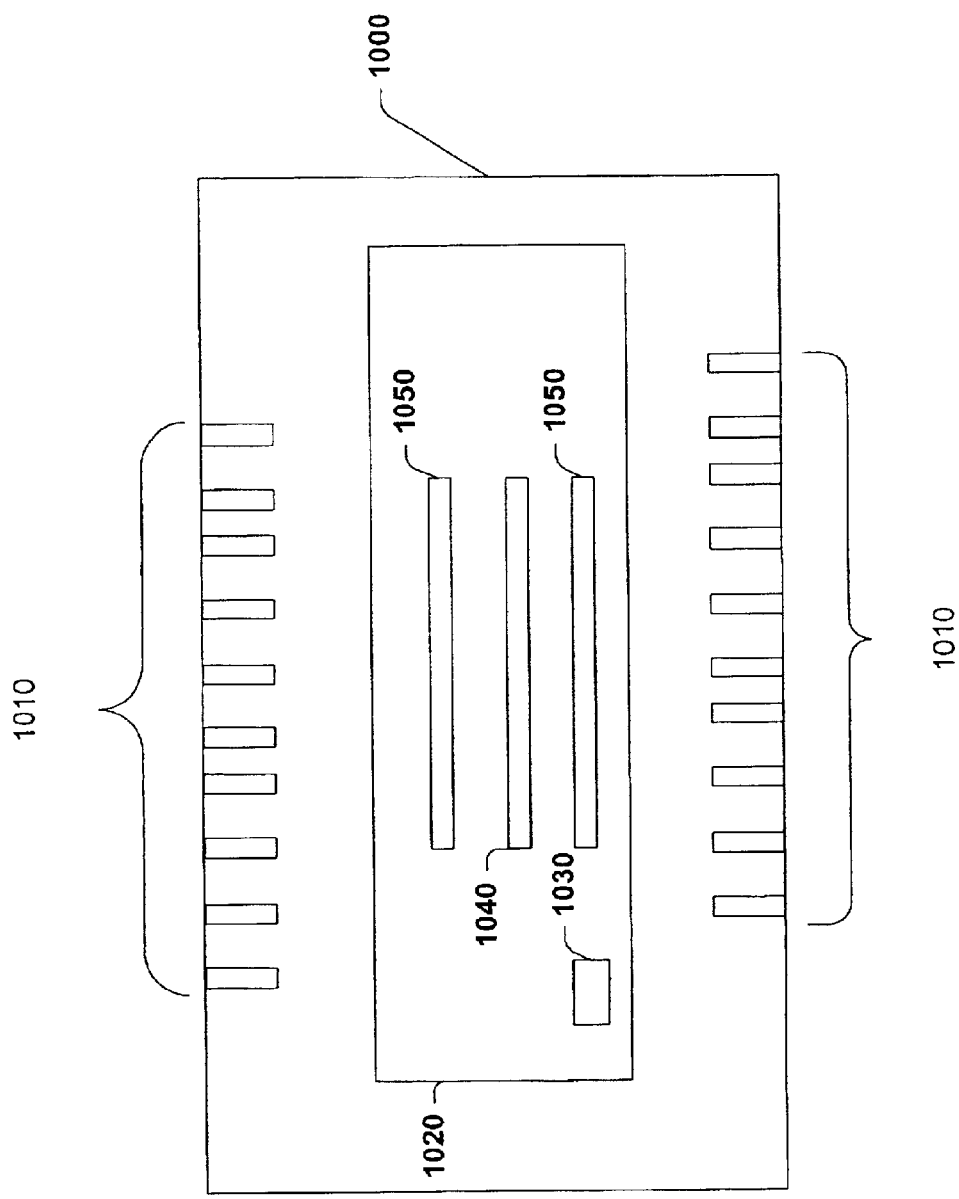

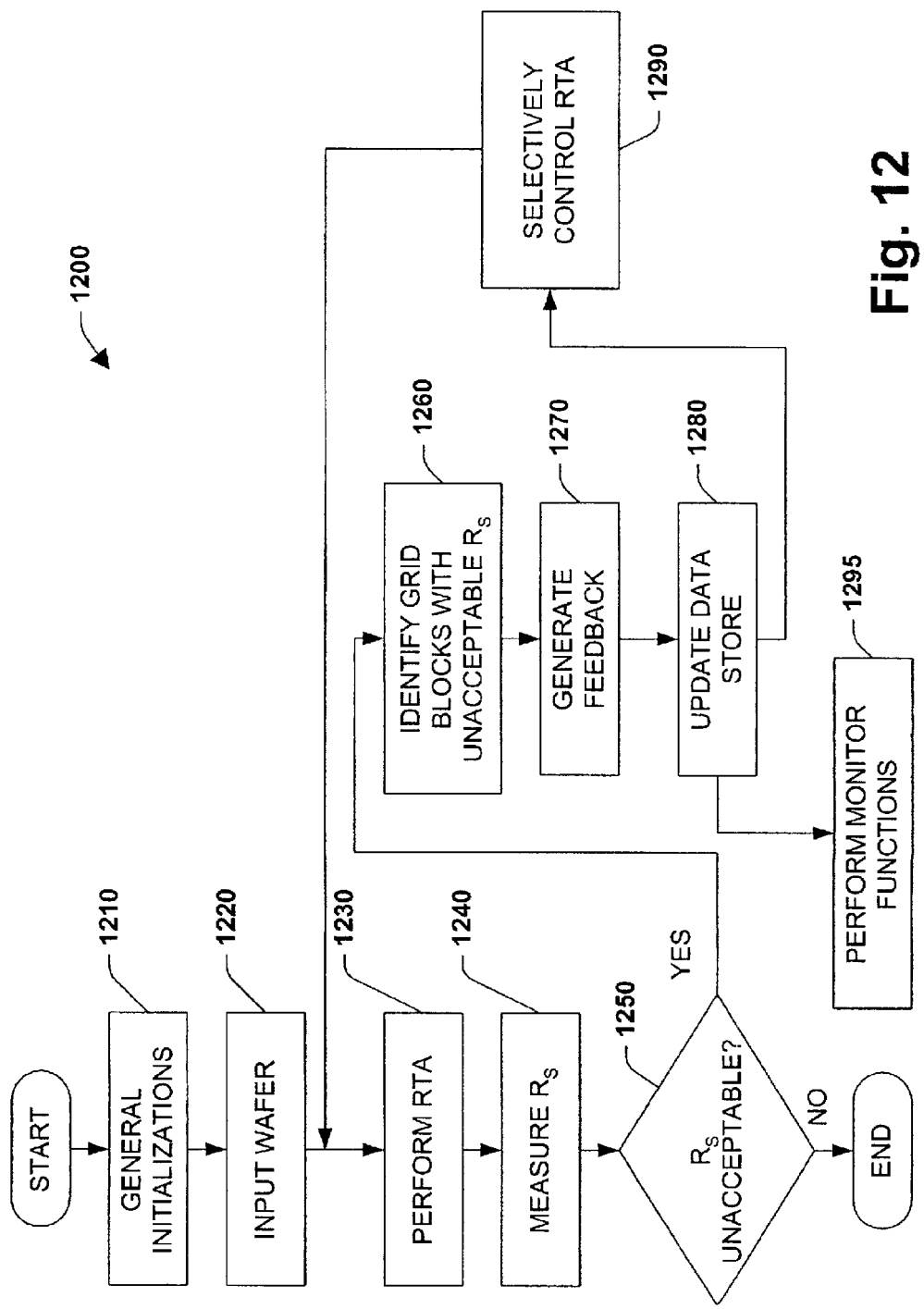

IN SITU MONITORING OF SHEET RESISTIVITY OF SILICIDES DURING RAPID THERMAL ANNEALING USING ELECTRICAL METHODS

TECHNICAL FIELD

The present invention generally relates to semiconductor fabrication, and in particular to systems and methods for monitoring sheet resistivity of silicides during rapid thermal annealing (RTA) and for controlling RTA based on such monitoring.

BACKGROUND OF THE INVENTION

In the semiconductor industry, there is a continuing trend toward manufacturing integrated circuits with a greater number of layers and with higher device densities. To achieve these greater number of layers and higher densities there have been, and continue to be, efforts towards reducing the thickness of layers, improving the uniformity of layers, reducing the thickness of devices and scaling down device dimensions (e.g., at sub micron levels) on semiconductor wafers. In order to accomplish higher device packing densities, thinner layers and more uniform layers with more precisely controlled conductivity and/or resistivity are required. This can include the thickness of gate oxide materials, (e.g., silicon oxide, silicon nitride, silicon oxynitride), thin films, and other layers.

The process of manufacturing semiconductors, or integrated circuits (commonly called ICs, or chips), typically consists of more than a hundred steps, during which hundreds of copies of an integrated circuit can be formed on a single wafer. Generally, the process involves creating several layers on and in a substrate that ultimately forms the complete integrated circuit. This layering process can create electrically active regions in and on the semiconductor wafer surface. Insulation and conductivity between such electrically active regions can be important to reliable operation of such integrated circuits. Thus, controlling the thickness, uniformity and conducting and/or insulating properties of layers created during the layering process can be important to the reliable operation of such integrated circuits.

Rapid thermal annealing (RTA) can be employed in fabricating one or more layers on a semiconductor. RTA is known to those skilled in the art, and thus for the sake of brevity is only briefly discussed herein. RTA is one form of rapid thermal processing (RTP) wherein a wafer is heated to a specific, usually high temperature for short periods of time. There are at least two forms of RTA commonly employed in semiconductor manufacturing. Adiabatic annealing refers to RTA where the heating time is less than $10^{-7}$ seconds. When adiabatic annealing is employed, typically only a thin surface on a wafer is affected. Adiabatic annealing can be performed by a high energy laser pulse that heats and thus melts the desired material. Such high energy laser pulses may be focused on all and/or a part of a wafer to localize the RTA affects. Isothermal annealing involves heating processes longer than adiabatic annealing. Adiabatic annealing can be performed by heating associated with tungsten/halogen lamps and/or graphite resistive strips, for example, to heat a wafer from one or both sides, or to selectively heat a portion of a wafer.

One purpose of RTA can be to repair damage (e.g., lattice damage) caused during doping. Such damage can occur because implanting dopant atoms into a semiconductor can displace many atoms for each implanted ion. Electrical behavior after implantation can be dominated by deep-level electron and hole traps, which can capture carriers and make sheet resistivity high. Annealing can be employed to repair such lattice damage and to place dopant atoms on substitutional sites where they will be electrically active and facilitate producing desired conducting and/or insulating properties, as measured by sheet resistivity, for example.

Sheet resistivity of a semiconductor or thin metal film is the ratio of the potential gradient (electric field) parallel with the current to the product of the current density and thickness. RTA can affect sheet resistivity by, for example, affecting the thickness, uniformity, composition and lattice configuration of semiconductor materials. Sheet resistivity can be important to the proper operation of a semiconductor, and thus, producing wafers with sheet resistivity within a desired range is important.

Difficulties in forming a layer, with precise thickness and/or uniformity, and thus with precise resistivity, have limited the effectiveness and/or properties of semiconductor devices manufactured by conventional techniques. The more precisely a layer can be formed, the more precisely critical dimensions may be achieved, with a corresponding increase in semiconductor performance and reliability. Conventionally, due to non-uniform layer formation and inaccurate layer formation monitoring techniques, an undesired sheet resistivity may be encountered, thereby compromising semiconductor performance and reliability.

Conventional techniques for analyzing RTA results in situ (e.g, scanning electron microscopy), if employed, are not a direct measurement of the desired property, but rather are an indirect method for determining whether a desired sheet resistivity will be produced. Thus, results generated from such conventional techniques may not be as precise as desired, resulting in layers with a sheet resistivity not within a desired range.

Difficulties in precisely forming a layer with a precise sheet resistivity can occur for reasons including, but not limited to, employing indirect measurement methods, variations within a wafer, variations between wafers in a lot, variations between wafer lots, wear and tear on RTA apparatus, local variations in a wafer caused by RTA, optical interference caused, for example, by etchings on a wafer, and miscalculations of RTA times and/or temperatures. Thus, a system for more precisely forming layers with sheet resistivity within a more precise range is still required.

SUMMARY OF THE INVENTION

This section presents a simplified summary of the invention in order to provide a basic understanding of some aspects of the invention. This summary is not an extensive overview of the invention. It is not intended to identify key/critical elements of the invention nor is it intended to delineate the scope of the invention. Its sole purpose is to present some concepts of the invention in a simplified form as a prelude to the more detailed description that is presented later.

The present invention provides for a system that facilitates monitoring sheet resistivity of a layer on a wafer and for controlling rapid thermal annealing (RTA) of the layer. The system includes RTA components that perform RTA on the layer and one or more sheet resistivity analyzing components that analyze the sheet resistivity of one or more portions of the layer upon which the RTA components perform the RTA. The system further includes a feedback generator that accepts sheet resistivity data from the analyzing components and produces feedback information that can be employed to control the one or more RTA components.

One or more RTA heating components can be arranged to correspond to a particular wafer portion. Each RTA heating component may be responsible for heating a portion of a layer during RTA. The RTA heating components are selectively driven by the system to heat one or more particular wafer portions during RTA at a desired temperature for a desired time. The progress and/or acceptability of the annealing is monitored by the system by comparing sheet resistivity measured by electrical methods to a desired sheet resistivity. Different wafers and even different portions of a wafer may benefit from different sheet resistivity. By monitoring sheet resistivity at one or more wafer portions, the present invention enables selective RTA to achieve desired sheet resistivity. As a result, more optimal layer formation is achieved, which in turn improves semiconductor device manufacturing.

Another aspect of the present invention provides a system that facilitates monitoring sheet resistivity of a layer on a wafer by electrical methods and for controlling rapid thermal annealing (RTA) of the layer. The system includes a data store that can be utilized to facilitate generating feedback information that can be employed to control RTA. The data store can also be utilized to facilitate machine learning that can be employed to perform RTA control.

Yet another aspect of the present invention provides a system that facilitates monitoring sheet resistivity of a layer on a wafer by electrical methods and for controlling rapid thermal annealing (RTA) of the layer. The system includes a monitoring application that can be employed to analyze feedback information generated by a feedback generator and/or to analyze data stored in a data store. The analyses performed by the monitoring application can be employed to generate information including, but not limited to, productivity reports, error reports and maintenance schedules.

Another aspect of the present invention provides a method for regulating layer formation. The method includes partitioning a layer into portions, performing rapid thermal annealing on a portion and measuring sheet resistivity in the portions using electrical methods. Sheet resistivity measurements are analyzed to determine whether an acceptable sheet resistivity exists at the portions and the analysis is employed to generate feedback information that can be sent to RTA components and employed to control RTA components corresponding to layer portions.

Still yet another aspect of the present invention provides a system for regulating layer formation on a silicide wafer including first sensing means for sensing conducting properties of a layer; second sensing means sensing insulating properties of a layer; rapid thermal processing means for heating a layer; and controlling means for selectively controlling the rapid thermal processing means so as to regulate layer formation.

To the accomplishment of the foregoing and related ends, the invention, then, comprises the features hereinafter fully described and particularly pointed out in the claims. The following description and the annexed drawings set forth in detail certain illustrative aspects of the invention. These aspects are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 6 is a perspective illustration of a substrate having a layer to which RTA and sheet resistivity analysis are applied in accordance with an aspect of the present invention.

FIG. 7 is a representative three-dimensional grid map of a layer illustrating sheet resistivity measurements taken at grid blocks of the grid map in accordance with an aspect of the present invention.

FIG. 8 is a layer sheet resistivity measurement table correlating the sheet resistivity measurements of FIG. 6 with desired values for the resistivity measurements in accordance with an aspect of the present invention.

FIG. 9 is a simplified perspective view of an incident wave reflecting off a wafer, being transmitted through the wafer and being emitted by the wafer to demonstrate the operation of Kirchoff's law.

FIG. 10 is a simplified, representative view of an RTA process chamber incorporating sheet resistivity analysis apparatus employed in accordance with an aspect of the present invention.

FIG. 12 is a flow diagram illustrating another example methodology for carrying out the present invention.

DETAILED DESCRIPTION OF THE INVENTION

Figure 1:
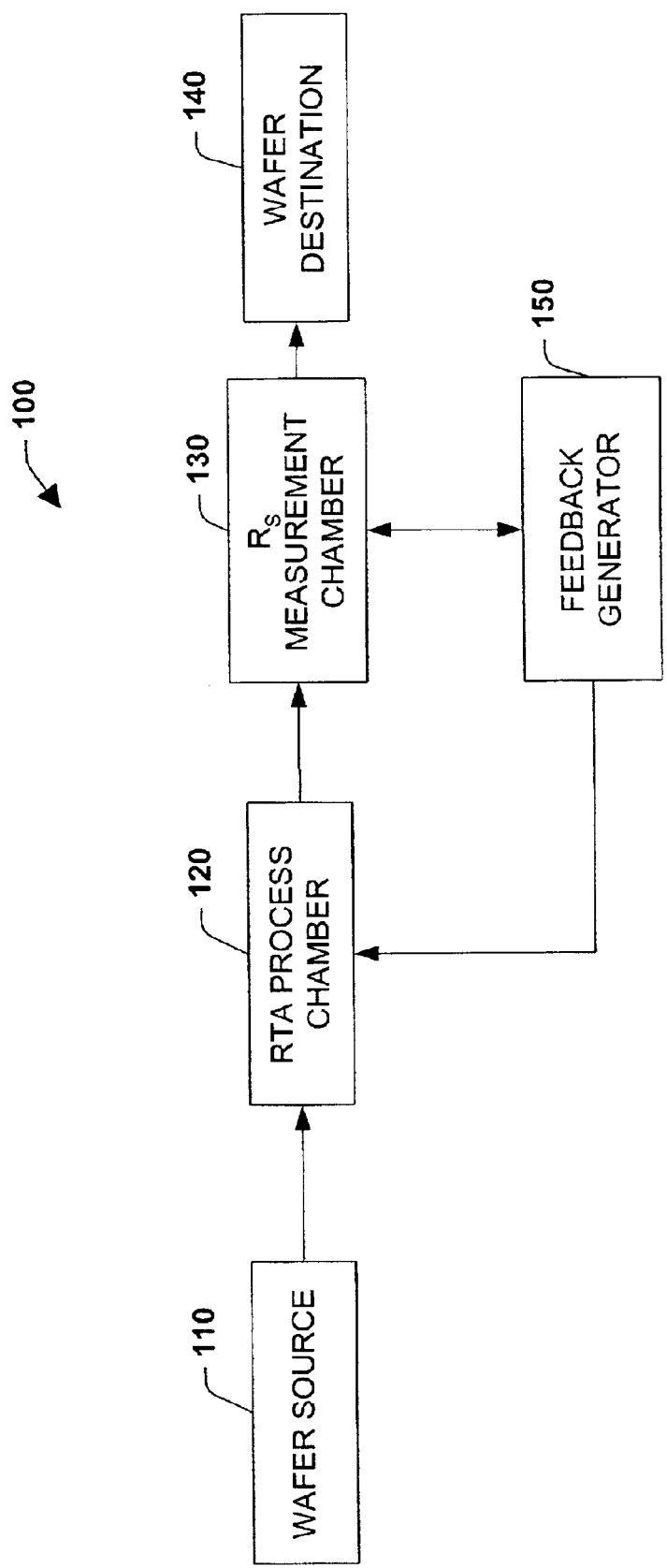
FIG. 1 is a schematic block diagram of a system for monitoring sheet resistivity and for controlling rapid thermal annealing (RTA) process in accordance with an aspect of the present invention.

The present invention will now be described with reference to the drawings, wherein like reference numerals are used to refer to like elements throughout. The present invention will be described with reference to a system for controlling layer formation using one or more RTA heating components and a sheet resistivity analysis and feedback system. It should be understood that the description of these exemplary aspects are merely illustrative and that they should not be taken in a limiting sense.

It is to be appreciated that various aspects of the present invention may employ technologies associated with facilitating unconstrained optimization and/or minimization of error costs. Thus, non-linear training systems/methodologies (e.g., back propagation, Bayesian, fuzzy sets, non-linear regression, or other neural networking paradigms including mixture of experts, cerebella model arithmetic computer (CMACS), radial basis functions, directed search networks and function link networks may be employed.

Referring initially to FIG. 1, a system 100 for monitoring sheet resistivity and for controlling a rapid thermal annealing (RTA) process is illustrated. The system includes a wafer source 110 from which wafers can be presented to an RTA process chamber 120. The wafer source 110 can include, but is not limited to, mechanical, computer, and manual sources. For example, a first wafer source 110 can be a computerized wafer inventory programmed to deliver wafers to the RTA process chamber 120 while a second wafer source 110 can be a technician manually delivering wafers to the RTA process chamber 120. Further, the wafer source 110 may be other apparatus employed in semiconductor processing (e.g., stepper, spin track, $R_s$ measurement chamber 130). The RTA process chamber 120 can be any of a variety of RTA chambers known to those skilled in the art. Thus, the RTA process chamber 120 illustrated is merely representative of such known RTA chambers.

The system 100 further includes the sheet resistivity ($R_s$) measurement chamber 130. The $R_s$ measurement chamber 130 illustrated is a representative $R_s$ chamber. Sheet resistivity ($R_s$) of a semiconductor or thin metal film is the ratio of the potential gradient (electric field) parallel to a current conducted by the sheet to the product of the current density and layer area and thickness. $R_s$ measurements may be made using a variety of electrical methods which monitor the potential gradient, the current conducted by the sheet, the current density and the layer area and thickness. By way of illustration, the potential gradient can be measured by apparatus including, but not limited to, a Gauss meter. Current is the flow of charge per unit of time. Thus, current conducted by the sheet can be measured by apparatus including, but not limited to, an ammeter, for example. Current density is the flow of charge per unit time over an area. Thus, current density can be measured by methods including, but not limited to, comparing measured current to the area over which the current was conducted. The area and/or thickness of the layer can be measured by any suitable conventional measuring apparatus and/or method (e.g., ruler, micrometer, laser width determiner). Measurements including the potential gradient, the current, the current density and the area employed in determining the current density can be performed, in one example aspect of the present invention, by a four point probe. Since current may not flow uniformly through a layer, in one example aspect of the present invention, multiple measurements of potential gradient, the current, the current density and the area employed in determining the current density can be performed, with such measurements then being subjected to numerical methods including, but not limited to, averaging, regression analysis, statistical analysis and determining maximums and minimums to produce $R_s$ measurements.

$R_s$ measurements taken in the $R_s$ chamber 130 are fed to a feedback generator 150. The feedback generator 150 can be, but is not limited to being, a computer application, a computer process, a thread, an object, a computer, a processor, and/or a mixture of computer applications, computer processes, threads, objects, computers and processors. The feedback generator 150 can be implemented in a single computer application, computer process, thread, object, computer and/or processor and/or may be distributed between two or more co-operating computer applications, computer processes, threads, objects, computers and processors. The feedback generator 150 can be employed to generate feedback information that can be fed back to the RTA process chamber 120 to control RTA performed in the RTA process chamber 120. By way of illustration, the feedback generator 150 may generate feedback information that causes the RTA process chamber 120 to increase the time and/or temperature to be employed for performing RTA on a specified lot of wafers based, at least in part, on $R_s$ measurements obtained from the $R_s$ measurement chamber 130. For example, $R_s$ measurements taken in the $R_s$ measurement chamber 130 may indicate that wafers from a first wafer lot have a first average $R_s$ after RTA performed in the RTA process chamber 120 under a first set of RTA conditions. The feedback generator 150 may determine that the first average $R_s$ is unacceptably high, and thus may generate feedback information to control the RTA performed in the RTA process chamber by updating the first set of RTA conditions to facilitate achieving lower average $R_s$.

The system 100 also includes a wafer destination 140. Like the wafer source 110, the wafer destination 140 can include, but is not limited to, mechanical, computer, and manual destinations. For example, a first wafer destination 140 can be a computerized wafer inventory programmed to accept wafers from the $R_s$ measurement chamber 130 while a second wafer destination 140 can be a technician manually retrieving wafers from the $R_s$ measurement chamber 130. Further, the wafer destination 140 may be other apparatus employed in semiconductor processing (e.g., stepper, spin track, RTA process chamber 120).

Figure 2:
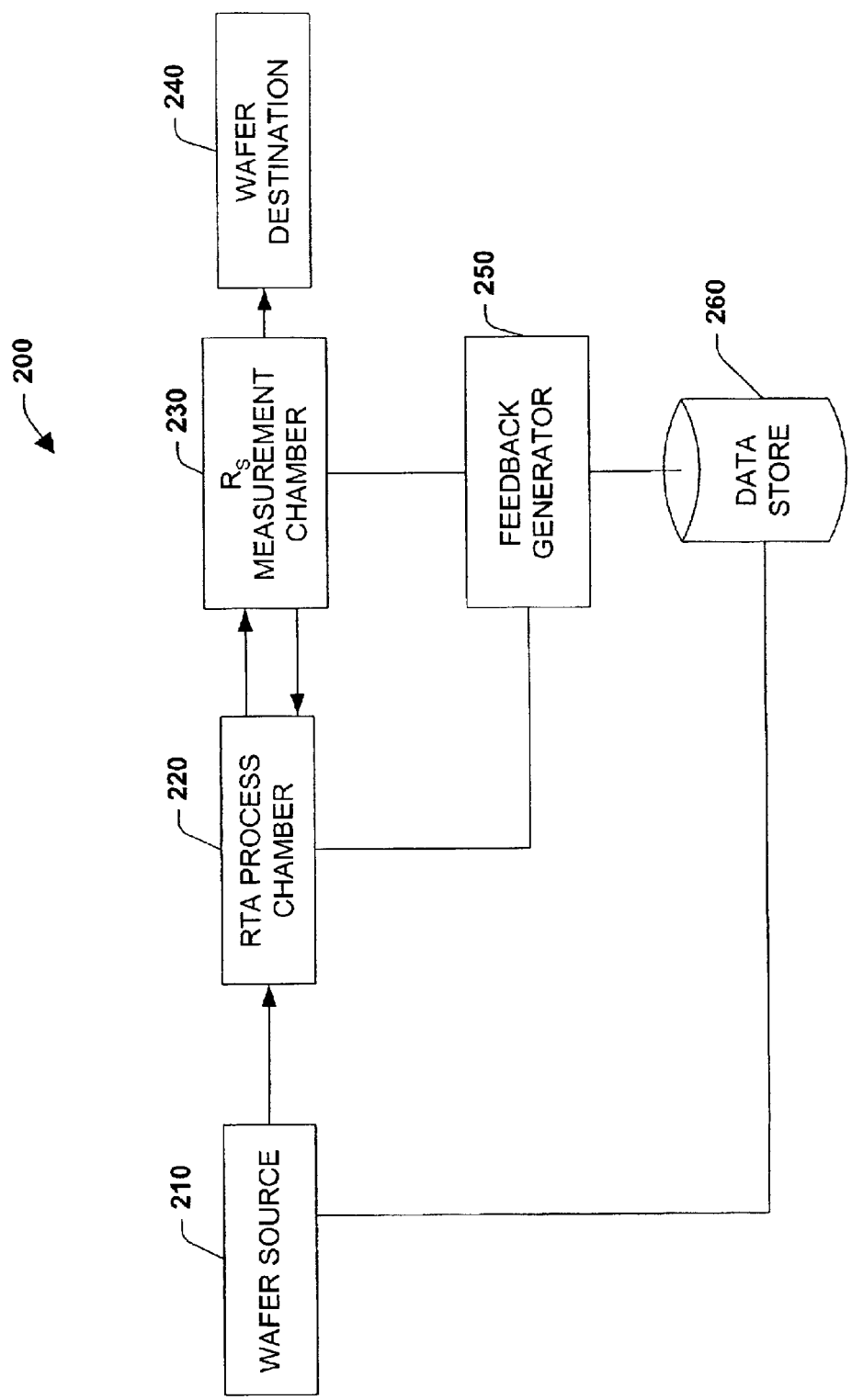
FIG. 2 is schematic block diagram of a system for monitoring sheet resistivity and for controlling rapid thermal annealing (RTA) that includes a data store that can be employed to facilitate controlling an RTA process and/or in machine learning in accordance with an aspect of the present invention.

Turning now to FIG. 2 a system 200 for monitoring sheet resistivity ($R_s$) and for controlling rapid thermal annealing (RTA) is illustrated. The system 200 includes a data store 260 that can be employed to facilitate controlling RTA processing in an RTA process chamber 220 and/or in machine learning that can similarly be employed in controlling RTA processing in the RTA process chamber 220. The data store 260 can be, but is not limited to being, one or more databases, tables, records, arrays, stacks, queues, heaps, lists, linked lists and data cubes. The data store 260 can store information in one physical location and/or can distribute stored information between physical locations. In one exemplary aspect of the present invention, the data store 260 is operably connected to at least one of a feedback generator 250, an $R_s$ measurement chamber 230, the RTA processing chamber 220, a wafer source 210 and a wafer destination 240. The data store 260 can be employed to facilitate machine learning in the system 200. For example, the data store 260 can accept $R_s$ measurements from the $R_s$ measurement chamber 230 and facilitate correlating such measurements with information including, but not limited to, feedback generated from the feedback generator 250 and wafer information (e.g., wafer size, wafer composition, wafer supplier), processing stage data, RTA chamber data, sheet resistivity chamber data, RTA time parameters, RTA heat parameters and layer composition. Such correlations can be processed in machine learning to adapt RTA processing performed in the RTA process chamber 220. By way of illustration, if correlative data interpreted by machine learning facilitated by the data store 260 indicates that a certain manufacturer of wafers provides wafers that consistently require higher RTA temperatures to achieve desired $R_s$ measurements, then the machine learning may adapt RTA processing performed in the RTA process chamber 220 when wafers from such a wafer manufacturer are provided.

The system includes the wafer source 210 from which wafers can be presented to the RTA process chamber 220.

The wafer source 210 can include, but is not limited to, mechanical, computer, and manual sources. For example, a first wafer source 210 can be a computerized wafer inventory programmed to deliver wafers to the RTA process chamber 220 while a second wafer source 210 can be a technician manually delivering wafers to the RTA process chamber 220. Further, the wafer source 210 may be other apparatus employed in semiconductor processing (e.g., stepper, spin track, $R_s$ measurement chamber 230). The RTA process chamber 220 can be any of a variety of RTA chambers known to those skilled in the art. Thus, the RTA process chamber 220 illustrated is merely representative of such known RTA chambers.

The system 200 further includes the sheet resistivity ($R_s$) measurement chamber 230. $R_s$ measurements taken in the $R_s$ chamber 230 are fed to a feedback generator 250. The feedback generator 250 can be, but is not limited to being, a computer application, a computer process, a thread, an object, a computer, a processor, and/or a mixture of computer applications, computer processes, threads, objects, computers and processors. The feedback generator 250 can be implemented in a single computer application, computer process, thread, object, computer and/or processor and/or may be distributed between two or more co-operating computer applications, computer processes, threads, objects, computers and processors. The feedback generator 250 can be employed to generate feedback information that can be fed back to the RTA process chamber 220 to control RTA performed in the RTA process chamber 220. By way of illustration, the feedback generator 250 may generate feedback information that causes the RTA process chamber 220 to increase the time and/or temperature to be employed for performing RTA on a specified lot of wafers based, at least in part, on $R_s$ measurements obtained from the $R_s$ measurement chamber 230. For example, measurements taken in the $R_s$ measurement chamber 230 may indicate that wafers from a first lot have a first average $R_s$ after RTA performed in the RTA process chamber 220. The feedback generator 250 may determine that the first average $R_s$ is unacceptably high, and thus may generate feedback information to control the RTA performed in the RTA process chamber to facilitate achieving lower average $R_s$. For example, the feedback generator 250 may generate feedback information that will lower the temperature at which RTA is performed.

The system 200 also includes a wafer destination 240. Like the wafer source 210, the wafer destination 240 can include, but is not limited to, mechanical, computer, and manual destinations. For example, a first wafer destination 240 can be a computerized wafer inventory programmed to accept wafers from the $R_s$ measurement chamber 230 while a second wafer destination 240 can be a technician manually retrieving wafers from the $R_s$ measurement chamber 230. Further, the wafer destination 240 may be other apparatus employed in semiconductor processing (e.g., stepper, spin track, RTA process chamber 220).

A wafer passed from the RTA process chamber 220 to the $R_s$ measurement chamber 230 can be passed back to the RTA process chamber 220 based, at least in part, on $R_s$ measurements taken in the $R_s$ measurement chamber 230. Thus, a wafer may be processed and reprocessed until such time as a desired $R_s$ is achieved, or a determination is made that a desired $R_s$ cannot be achieved. In an alternative aspect of the present invention, the $R_s$ measurements for a first wafer will not be employed to reprocess the wafer from which the $R_s$ measurements were taken, but rather will be employed to adapt RTA processing conditions for subsequent wafers.

Figure 3:
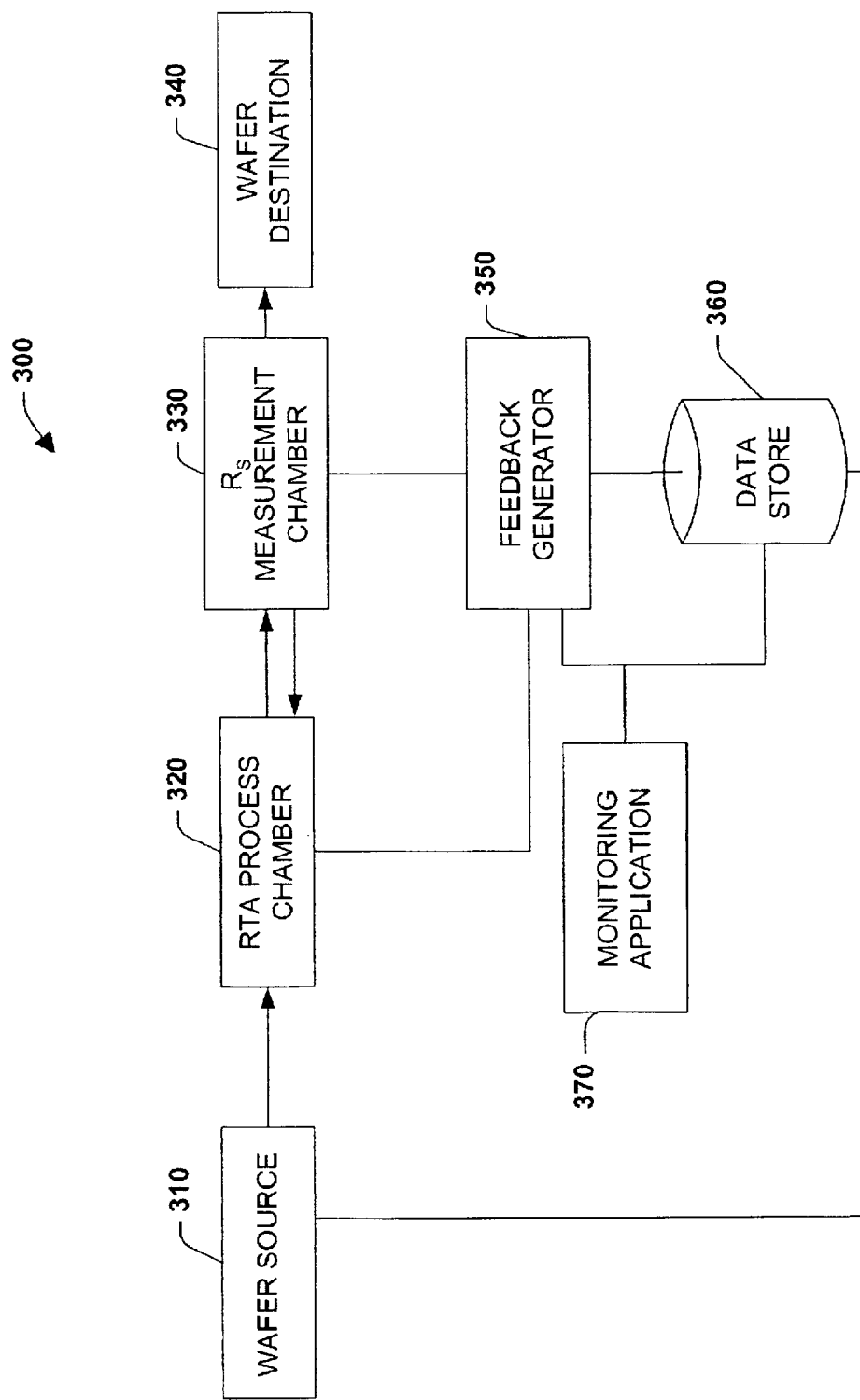
FIG. 3 is schematic block diagram of a system for monitoring sheet resistivity and for controlling rapid thermal annealing (RTA) that includes a monitoring application that can be employed in scheduling maintenance for one or more components in the system in accordance with an aspect of the present invention.

Turning now to FIG. 3 a system 300 for monitoring sheet resistivity and for controlling rapid thermal annealing (RTA) that includes a monitoring application 370 that can be employed in scheduling maintenance for one or more components in the system 300 is illustrated. The monitoring application 370 can be, but is not limited to being, a computer application, a computer process, a thread, an object, a computer, a processor, and/or a mixture of computer applications, computer processes, threads, objects, computers and processors. The monitoring application 370 can be implemented in a single computer application, computer process, thread, object, computer and/or processor and/or may be distributed between two or more co-operating computer applications, computer processes, threads, objects, computers and processors. The monitoring application 370 can examine information including, but not limited to, sheet resistivity measurements (e.g., potential gradient, current, current density), the feedback information, RTA time parameters, RTA heat parameters, layer composition, wafer size, wafer composition, wafer supplier, processing stage data, RTA chamber data and sheet resistivity chamber data to determine whether one or more reports, schedules and/or actions should be produced. For example, the monitoring application 370 may correlate resistivity measurements with the feedback information and determine that an RTA process chamber 320 is operating in an undesired fashion (e.g., not achieving a desired temperature, not achieving a desired heating uniformity). Thus, the monitoring application 370 may produce an "undesirable operation" report and/or schedule maintenance for the RTA process chamber 320. Similarly, the monitoring application 370 may monitor data stored in a data store 360 and determine that the data store 360 is nearing storage capacity, and thus the monitoring application 370 may produce a "data store maintenance" report and/or schedule maintenance for the data store 360.

The system includes the wafer source 310 from which wafers can be presented to the RTA process chamber 320. The wafer source 310 can include, but is not limited to, mechanical, computer, and manual sources. For example, a first wafer source 310 can be a computerized wafer inventory programmed to deliver wafers to the RTA process chamber 320 while a second wafer source 310 can be a technician manually delivering wafers to the RTA process chamber 320. Further, the wafer source 310 may be other apparatus employed in semiconductor processing (e.g., stepper, spin track, $R_s$ measurement chamber 330). The RTA process chamber 320 can be any of a variety of RTA chambers known to those skilled in the art. Thus, the RTA process, chamber 320 illustrated is merely representative of such known RTA chambers.

The system 300 further includes the sheet resistivity ($R_s$) measurement chamber 330. $R_s$ measurements taken in the $R_s$ chamber 330 are fed to a feedback generator 350. The feedback generator 350 can be, but is not limited to being, a computer application, a computer process, a thread, an object, a computer, a processor, and/or a mixture of computer applications, computer processes, threads, objects, computers and processors. The feedback generator 350 can be implemented in a single computer application, computer process, thread, object, computer and/or processor and/or may be distributed between two or more co-operating computer applications, computer processes, threads, objects, computers and processors. The feedback generator 350 can be employed to generate feedback information that can be fed back to the RTA process chamber 320 to control RTA performed in the RTA process chamber 320. By way of illustration, the feedback generator 350 may generate feedback information that causes the RTA process chamber 320 to increase the time and/or temperature to be employed for performing RTA on a specified lot of wafers based, at least in part, on $R_s$ measurements obtained from the $R_s$ measurement chamber 330. For example, $R_s$ measurements taken in the $R_s$ measurement chamber 330 may indicate that wafers from a first lot have a first average $R_s$ after RTA performed in the RTA process chamber 320. The feedback generator 350 may determine that the first average $R_s$ is unacceptably high, and thus may generate feedback information to control the RTA performed in the RTA process chamber to facilitate achieving lower average $R_s$. For example, the feedback information may be employed to raise the temperature and time for which RTA is performed for the first lot of wafers.

The system 300 also includes a wafer destination 340. Like the wafer source 310, the wafer destination 340 can include, but is not limited to, mechanical, computer, and manual destinations. For example, a first wafer destination 340 can be a computerized wafer inventory programmed to accept wafers from the $R_s$ measurement chamber 330 while a second wafer destination 340 can be a technician manually retrieving wafers from the $R_s$ measurement chamber 330. Further, the wafer destination 340 may be other apparatus employed in semiconductor processing (e.g., stepper, spin track, RTA process chamber 320).

A wafer passed from the RTA process chamber 320 to the $R_s$ measurement chamber 330 can be passed back to the RTA process chamber 320 based, at least in part, on $R_s$ measurements taken in the $R_s$ measurement chamber 330. Thus, a wafer may be processed and reprocessed until such time as a desired $R_s$ is achieved, or a determination is made that a desired $R_s$ cannot be achieved. Thus, in one example aspect of the present invention, $R_s$ measurements taken from a wafer may be employed in reprocessing that wafer through the RTA process chamber 320. In another example aspect of the present invention, $R_s$ measurements taken from a first wafer may not be employed in reprocessing that first wafer, but rather may be employed in adapting one or more RTA conditions in the RTA process chamber 320 for subsequently processed wafers.

Figure 4:
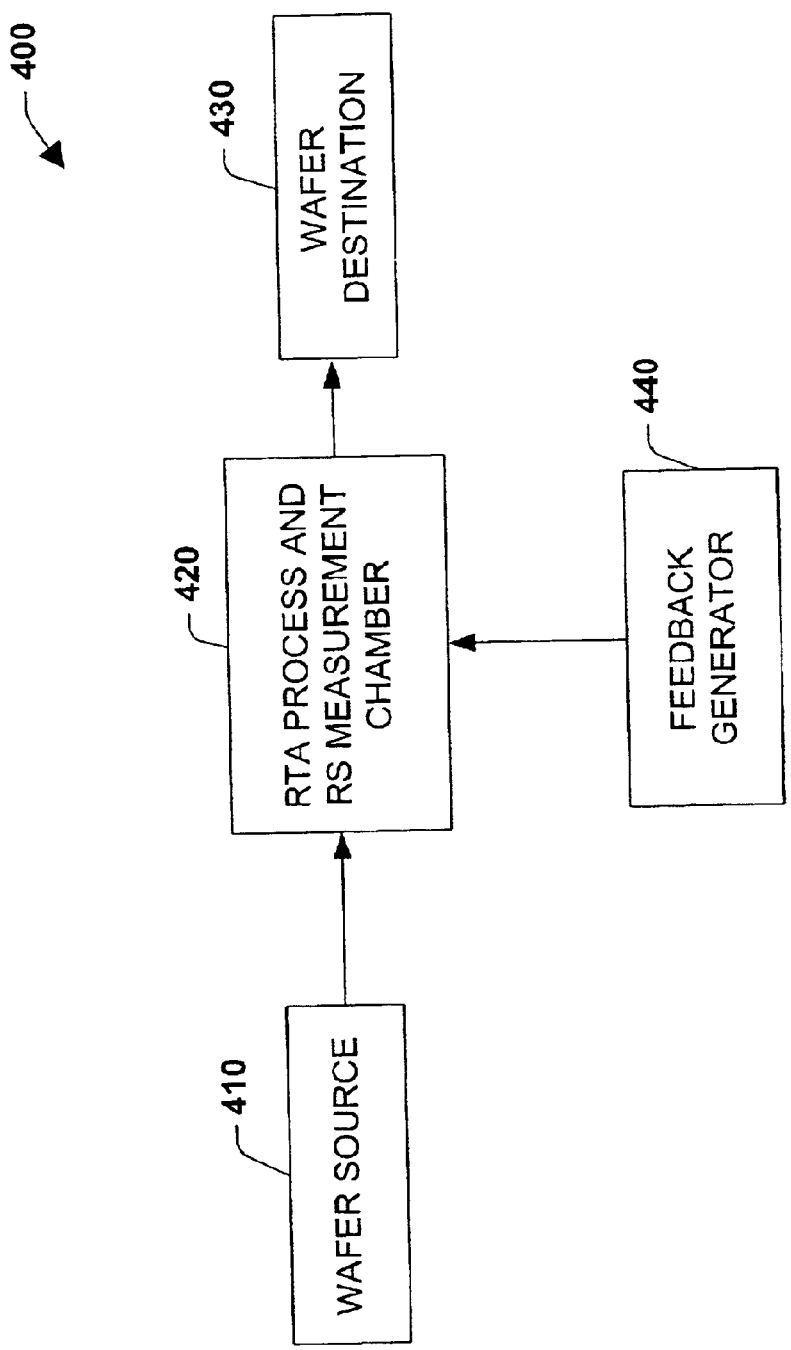
FIG. 4 is a schematic block diagram of a system for monitoring sheet resistivity and for controlling a rapid thermal annealing (RTA) process where the RTA and sheet resistivity monitoring occur in the same apparatus in accordance with an aspect of the present invention.

Referring now to FIG. 4, a system 400 for monitoring sheet resistivity and for controlling a rapid thermal annealing (RTA) process where the RTA and sheet resistivity monitoring occur in the same apparatus is illustrated. The system includes an RTA process and $R_s$ measurement chamber 420 (the chamber 420), wherein both RTA processing and $R_s$ measuring can occur. In one exemplary aspect of the present invention, the RTA processing and $R_s$ measurement are performed serially, while in another exemplary aspect of the present invention, the RTA processing and the $R_s$ measurement are performed substantially in parallel.

The system 400 includes a wafer source 410 from which wafers can be presented to the chamber 420. The wafer source 410 can include, but is not limited to, mechanical, computer, and manual sources. For example, a first wafer source 410 can be a computerized wafer inventory programmed to deliver wafers to the chamber 420 while a second wafer source 410 can be a technician manually delivering wafers to the chamber 420. Further, the wafer source 410 may be other apparatus employed in semiconductor processing (e.g., stepper, spin track).

$R_s$ measurements (e.g., potential gradient, current, current density) taken in the chamber 420 are forwarded to a feedback generator 440. The feedback generator 440 can be, but is not limited to being, a computer application, a computer process, a thread, an object, a computer, a processor, and/or a mixture of computer applications, computer processes, threads, objects, computers and processors.

The feedback generator 440 can be implemented in a single computer application, computer process, thread, object, computer and/or processors and/or may be distributed between two or more co-operating computer applications, computer processes, threads, objects, computers and processors. The feedback generator 440 can be employed to generate feedback information that can be fed back to the chamber 420 to control RTA performed in the chamber 420. By way of illustration, the feedback generator 440 may generate feedback information that causes the chamber 420 to increase the time and/or temperature to be employed for performing RTA on a specified lot of wafers based, at least in part, on $R_s$ measurements taken in the chamber 420. By way of further illustration, the feedback generator 440 may generate feedback information that causes one of a plurality of heating elements to be selectively adapted (e.g., heat output increased) as compared to other heating elements. For example, measurements taken in the chamber 420 may indicate that wafers from a first lot have a first average $R_s$ in a first region on the wafer after RTA while the wafers have a second average $R_s$ in all other regions on the wafer after RTA. The feedback generator 440 may determine that the first average $R_s$ is unacceptably high, and thus may generate feedback information to control the RTA to facilitate achieving lower average $R_s$. Such feedback information may selectively adapt a heating element to increase heat output as compared to other heating elements in the chamber 420.

The system 400 also includes a wafer destination 430. Like the wafer source 410, the wafer destination 430 can include, but is not limited to, mechanical, computer, and manual destinations. For example, a first wafer destination 430 can be a computerized wafer inventory programmed to accept wafers from the chamber 420 while a second wafer destination 430 can be a technician manually retrieving wafers from the chamber 420. Further, the wafer destination 430 may be other apparatus employed in semiconductor processing (e.g., stepper, spin track).

Figure 5:
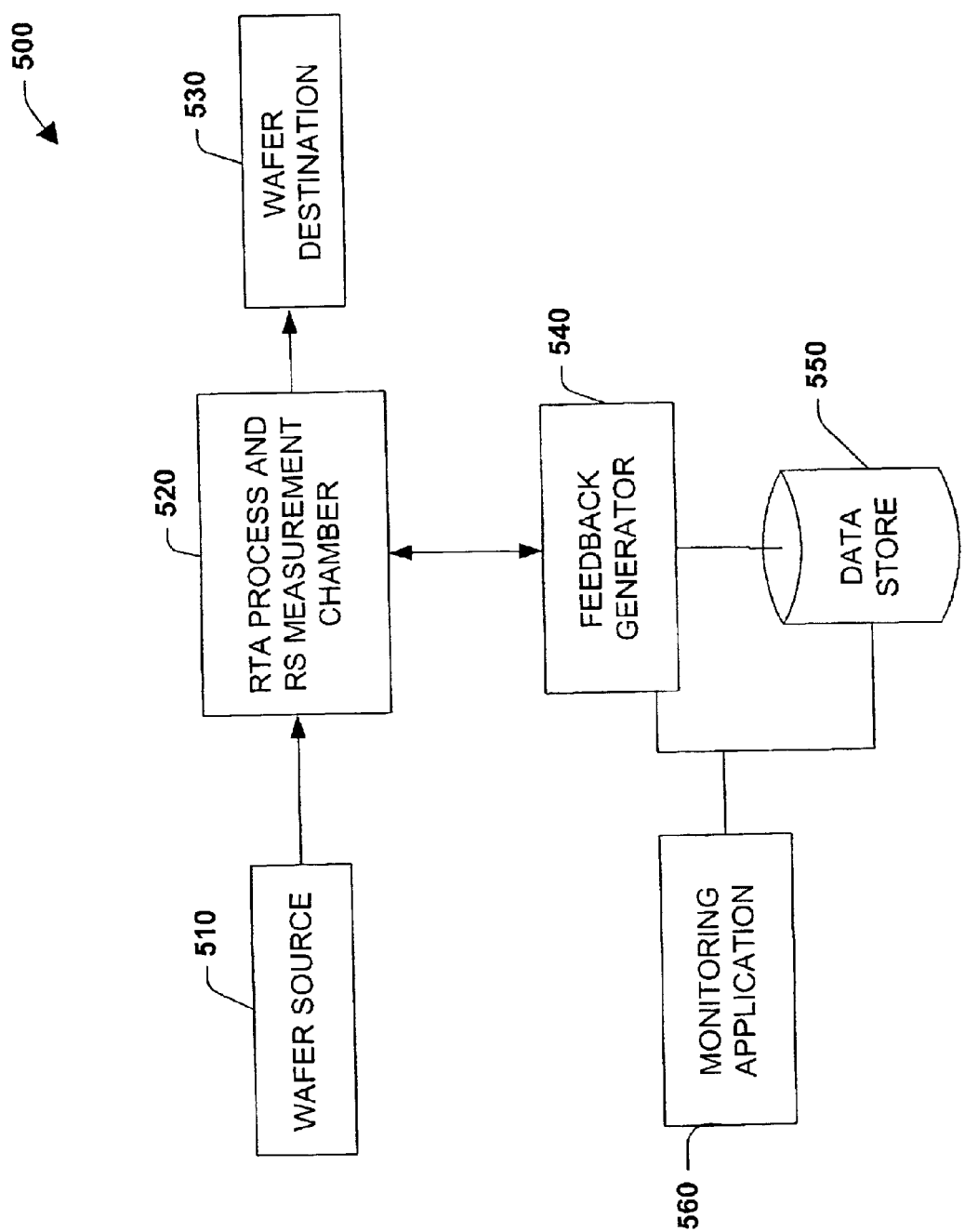
FIG. 5 is schematic block diagram of a system for monitoring sheet resistivity and for controlling a rapid thermal annealing (RTA) process where the RTA and sheet resistivity monitoring occur in the same apparatus that includes a monitoring application that can be employed in scheduling maintenance for one or more components in the system and that further includes a data store that can be employed facilitating controlling RTA and/or in machine learning in accordance with an aspect of the present invention.

Turning now to FIG. 5, a system 500 for monitoring sheet resistivity and for controlling a rapid thermal annealing (RTA) process where the RTA and sheet resistivity monitoring occur in the same apparatus and that includes a monitoring application 560 that can be employed in scheduling maintenance of one or more components in the system 500 and which further includes a data store 550 that can be employed facilitating controlling RTA and/or in machine learning is illustrated.

The system includes an RTA process and $R_s$ measurement chamber 520 (the chamber 520), wherein both RTA processing and $R_s$ measuring can occur. In one exemplary aspect of the present invention, the RTA processing and $R_s$ measurement are performed serially, while in another exemplary aspect of the present invention, the RTA processing and the $R_s$ measurement are performed substantially in parallel.

The system 500 includes a data store 550 that can be employed to facilitate controlling RTA processing in the chamber 520 and/or in machine learning that can similarly be employed in controlling RTA processing in the chamber 520. The data store 550 can be, but is not limited to being, one or more databases, tables, records, arrays, stacks, queues, heaps, lists, linked lists and data cubes. The data store 550 can store information in one physical location and/or can distribute stored information between physical locations. In one exemplary aspect of the present invention, the data store 550 is operably connected to at least one of the feedback generator 540, the chamber 520, the wafer source 510 and the wafer destination 530.

The data store 550 can be employed to facilitate machine learning in the system 500. For example, the data store 550 can accept $R_s$ measurements (e.g., potential gradient, current, current density) and facilitate correlating such measurements with information including, but not limited to, feedback generated from the feedback generator 540 and wafer information (e.g., wafer size, wafer composition, wafer supplier), processing stage data, RTA chamber data, sheet resistivity chamber data, RTA time parameters, RTA heat parameters and layer composition. Such correlations can be processed in machine learning to adapt RTA processing performed in the chamber 520. By way of illustration, if correlative data interpreted by machine learning facilitated by the data store 560 indicates that a certain manufacturer of wafers provides wafers that consistently require higher RTA temperatures to achieve desired $R_s$ measurements, then the machine learning may adapt RTA processing performed in the chamber 520 when wafers from such a wafer manufacturer are provided.

The system 500 includes a monitoring application 560 that can be employed in scheduling maintenance of one or more components in the system 500. The monitoring application 560 can be, but is not limited to being, a computer application, a computer process, a thread, an object, a computer, a processor, and/or a mixture of computer applications, processes, threads, objects, computers and processors. The monitoring application 560 can be implemented in a single computer application, computer process, thread, object, computer and/or processor and/or may be distributed between two or more co-operating computer applications, computer processes, threads, objects, computers and processors. The monitoring application 560 can examine information including, but not limited to, sheet resistivity measurements (e.g., potential gradient, current, current density), the feedback information, RTA time parameters, RTA heat parameters, layer composition, wafer size, wafer composition, wafer supplier, processing stage data, RTA chamber data and sheet resistivity chamber data to determine whether one or more reports, schedules and/or actions should be produced. For example, the monitoring application 560 may correlate resistivity measurements with the feedback information and determine that the chamber 520 is operating in an undesired fashion (e.g., taking too long to reach a desired temperature, not achieving a desired temperature). Thus, the monitoring application 560 may produce an "undesirable operation" report and/or schedule maintenance for the chamber 520. Similarly, the monitoring application 560 may monitor data stored in a data store 550 and determine that the data store 550 is nearing storage capacity, and thus the monitoring application 560 may produce a "data store maintenance" report and/or schedule maintenance for the data store 550.

The system 500 includes a wafer source 510 from which wafers can be presented to the chamber 520. The wafer source 510 can include, but is not limited to, mechanical, computer, and manual sources. For example, a first wafer source 510 can be a computerized wafer inventory programmed to deliver wafers to the chamber 520 while a second wafer source 510 can be a technician manually delivering wafers to the chamber 520. Further, the wafer source 510 may be other apparatus employed in semiconductor processing (e.g., stepper, spin track).

$R_s$ measurements (e.g., potential gradient, current, current density) taken in the chamber 520 are forwarded to a feedback generator 540. The feedback generator 540 can be, but is not limited to being, a computer application, a computer process, a thread, an object, a computer, a processor, and/or a mixture of computer applications, computer processes, threads, objects, computers and processors.

The feedback generator 540 can be implemented in a single computer application, computer process, thread, object, computer and/or processors and/or may be distributed between two or more co-operating computer applications, computer processes, threads, objects, computers and processors. The feedback generator 540 can be employed to generate feedback information that can be fed back to the chamber 520 to control RTA performed in the chamber 520. By way of illustration, the feedback generator 540 may generate feedback information that causes the chamber 520 to increase the time and/or temperature to be employed for performing RTA on a specified lot of wafers based, at least in part, on $R_s$ measurements taken in the chamber 520. For example, $R_s$ measurements taken in the chamber 520 may indicate that wafers from a first wafer lot have a first average $R_s$ after RTA. The feedback generator 540 may determine that the first average $R_s$ is unacceptably high, and thus may generate feedback information to control the RTA to facilitate achieving lower average $R_s$.

The system 500 also includes a wafer destination 530. Like the wafer source 510, the wafer destination 530 can include, but is not limited to, mechanical, computer, and manual destinations. For example, a first wafer destination 530 can be a computerized wafer inventory programmed to accept wafers from the chamber 520 while a second wafer destination 530 can be a technician manually retrieving wafers from the chamber 520. Further, the wafer destination 530 may be other apparatus employed in semiconductor processing (e.g., stepper, spin track).

Turning now to FIGS. 6–8 a chuck 30 is shown in perspective supporting a wafer 22 whereupon one or more layers 24 may be processed using, for example, RTA. The wafer 22 can be divided into a grid pattern as that shown in FIG. 6. Each grid block (XY) of the grid pattern corresponds to a particular portion of the wafer 22. Each portion is individually monitored for sheet resistivity and each portion is individually controlled for RTA.

In FIG. 7, each portion of the wafer 22 ($X_1Y_1 \ldots X_{12}, Y_{12}$) is being monitored for sheet resistivity. The sheet resistivity of each portion of the layer 24 is shown. The sheet resistivity of each portion of the layer 24 may have been calculated using, for example, a four point probe to take measurements including, but not limited to potential gradient, current and current density. Current may not flow uniformly through a sheet, and thus, as can be seen, the sheet resistivity at coordinate $X_7Y_6$ is substantially higher than the sheet resistivity of the other wafer 22 portions XY. It is to be appreciated that although FIG. 7 illustrates the wafer 22 being mapped (partitioned) into 144 grid block portions, the wafer 22 may be mapped with any suitable number of portions. Although the present invention is described with respect to one RTA component corresponding to one grid block XY, it is to be appreciated that any suitable number of RTA components corresponding to any suitable number of grid blocks may be employed.

FIG. 8 is a representative table of sheet resistivity measurements taken for the various grid blocks that have been correlated with acceptable resistivity values for the portions of the wafer 22 mapped by the respective grid blocks. As can be seen, all the grid blocks, except grid block $X_7Y_6$, have sheet resistivity measurements corresponding to an acceptable sheet resistivity value (TA) (e.g., are within an expected range of sheet resistivity measurements), while grid block $X_7Y_6$ has an undesired sheet resistivity value ($T_U$). Thus, a determination can be made that an undesirable sheet resistivity condition exists at the portion of the wafer 22 mapped by grid block $X_7Y_6$. Accordingly, one or more RTA components corresponding to the portion of the wafer 22 mapped at grid block $X_7Y_6$, can be controlled to change the conditions under which they perform RTA to bring the sheet resistivity of this portion of the wafer 22 to an acceptable level. For example, an RTA component associated with grid block $X_7Y_6$ maybe adapted to increase its heat output in an attempt to change the RTA results in grid block $X_7Y_6$ It is to be appreciated that the RTA components may be driven so as to maintain, increase and/or decrease the RTA conditions applied to the respective wafer 22 portions as desired.

Heat employed in RTA can be generated, for example, by a laser or by isothermal heating elements (e.g., halogen/tungsten lamp, graphite strips). The generated heat can travel from the heat source to the wafer to be heated in wave form. FIG. 9 illustrates an incident wave 910 reflecting off a wafer 920, being transmitted through the wafer 920 and being emitted by the wafer 920 to demonstrate the operation of Kirchoff's law and to illustrate how non-uniform annealing of a silicide layer on the wafer 920 can occur. Kirchoff's law, dealing with transmissive heating, in simplified form holds that reflection+transmission+emissivity generated by an incident wave equals unity, as compared to the incident wave. In FIG. 9, the incident wave 910 generates a reflected wave 930, a transmitted wave 940 and an emitted wave 950 when the incident wave 910 is directed at the wafer 920. The incident wave 910 may be employed in heating a silicide layer on the wafer 920 during RTA. But such RTA may not produce uniform heating of the wafer 920, and thus may not produce uniform RTA of the silicide layer on the wafer 920, which in turn may not produce uniform $R_s$ for the silicide layer on the wafer 920.

Non-uniform heating and thus non-uniform annealing may occur due to factors including, but not limited to, optical interference (e.g., features in the layer, particles in the RTA environment), variations within a wafer (e.g., layer thickness, layer uniformity, layer composition), variations between wafers (e.g., layer thickness, layer uniformity, layer composition), variations between heating elements in RTA apparatus and etchings in the layer. Such variations can affect one or more of the reflectivity, transmissivity, and emissivity of the incident wave 910 directed at the wafer 920 which can in turn affect the absorption of heat into the silicide layer on the wafer 920. Differential energy absorption can create a lateral temperature distribution across a wafer, which can affect $R_s$ uniformity. Since such variations are possible, the present invention facilitates measuring $R_s$ and feeding back information concerning $R_s$ measurements to other components (e.g., feedback generator 150, FIG. 1, RTA process chamber 120, FIG. 1). Such feedback information can be employed to adapt RTA processes and thus facilitate RTA of silicide layers that will have desired $R_s$ measurements, providing improvements over conventional systems.

Examples of types of silicide in accordance with the present invention include: cobalt, nickel, and titanium silicides. The silicide (e.g., titanium is deposited and annealed at 600° C., etched to remove undesired silicide and reannealed at 700° C. to form the final silicide.

FIG. 10 is a simplified, representative view of an RTA process chamber 1000 incorporating sheet resistivity analysis components 1050. Sheet resistivity ($R_s$) of a semiconductor or thin metal film is the ratio of the potential gradient (electric field) parallel to a current conducted by the sheet to the product of the current density and layer area and thickness. In FIG. 10, the sheet being measured would reside on the wafer 1040 found in the chamber 1000. $R_s$ measurements may be made using a variety of electrical methods which monitor the potential gradient, the current conducted by the sheet, the current density and the layer area and thickness. By way of illustration, the potential gradient can be measured by apparatus including, but not limited to, a Gauss meter. Current is the flow of charge per unit of time. Thus, current conducted by the sheet can be measured by apparatus including, but not limited to, an ammeter, for example. Current density is the flow of charge per unit time over an area. Thus, current density can be measured by methods including, but not limited to, comparing measured current to the area over which the current was conducted. The area and/or thickness of the layer can be measured by any suitable conventional measuring apparatus and/or method (e.g., ruler, micrometer, laser width determiner). The sheet resistivity analysis components 1050 illustrated are merely representative, as the application of such devices (e.g., Gauss meter, ammeter, micrometer, four point probe) are known in the art.

The RTA chamber 1000 includes a plurality of heating elements 1010 that can be selectively controlled to maintain, increase and/or decrease output to affect RTA of the layer on the wafer 1040. The RTA chamber 1000 further includes a thermometer 1030 employed in monitoring temperature inside an isolation chamber 1020 in the RTA chamber 1000. It is to be appreciated by one skilled in the art that any suitable arrangement of sheet resistivity analysis components 1050 can be employed in accordance with the present invention.

Figure 11:
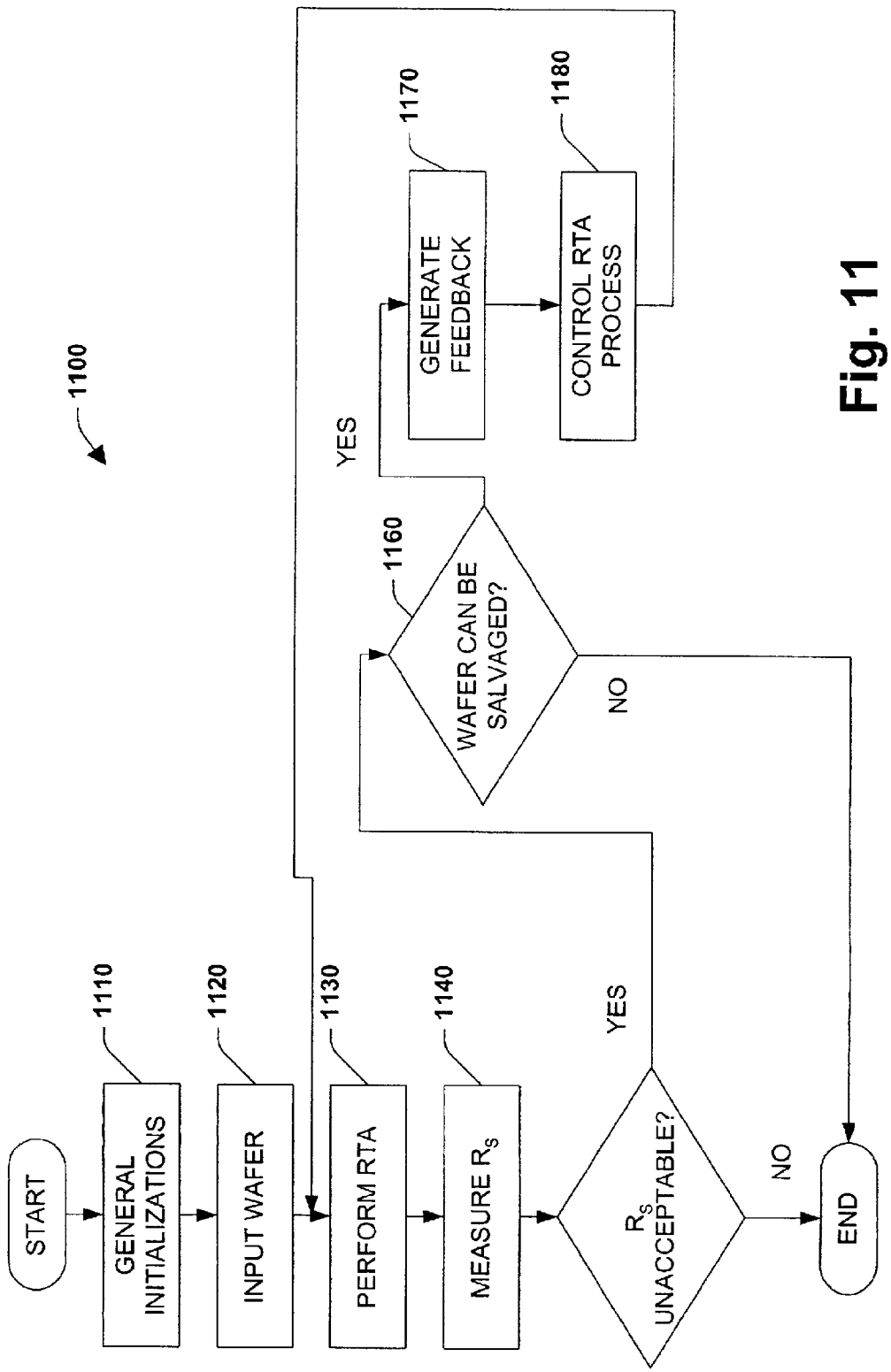
FIG. 11 is a flow diagram illustrating one example methodology for carrying out the present invention.

In view of the exemplary systems shown and described above, a methodology, which may be implemented in accordance with the present invention, will be better appreciated with reference to the flow diagrams of FIGS. 11 and 12. While, for purposes of simplicity of explanation, the methodologies are shown and described as a series of blocks, it is to be understood and appreciated that the present invention is not limited by the order of the blocks, as some blocks may, in accordance with the present invention, occur in different orders and/or concurrently with other blocks from that shown and described herein. Moreover, not all illustrated blocks may be required to implement a methodology in accordance with the present invention.

FIG. 11 is a flow diagram illustrating one example methodology for carrying out the present invention. At step 1100, general initializations are performed. Such initializations can include, but are not limited to, allocating memory, establishing pointers, establishing data communications, initializing variables and instantiating objects. At 1120, a wafer is input to the process and at 1130 RTA is performed on the wafer of 1120. It is to be appreciated by one skilled in the art that RTA techniques including, but not limited to, adiabatic and isothermal RTA may employed in accordance with the present invention. At 1140 sheet resistivity measurements are taken from the wafer upon which RTA was performed in 1130. For example, potential gradient, current and current density measurements can be taken at one or more locations on the wafer, with such measurements then being subjected to numerical and/or statistical analysis. At 1150 a determination is made concerning whether the sheet resistivity measurements and/or numerical and/or statistical analysis performed on the sheet resistivity measurements indicate that an unacceptable sheet resistivity condition exists for the wafer upon which RTA was performed. If the determination at 1150 is NO, that sheet resistivity measurements are acceptable, then processing can conclude.

If the determination at 1150 is YES, then at 1160 a determination maybe made concerning whether the wafer can be salvaged. By way of illustration, the sheet resistivity measurements may be so far outside desired ranges that attempting to correct the unacceptable condition would be futile. By way of further illustration, the wafer may have been processed and reprocessed so many times that further processing would be futile. If the determination at 1160 is NO, that the wafer cannot be salvaged, then the wafer may be removed from the process and/or marked for destruction, for example, and processing of that wafer concluded. If the determination at 1160 is YES, that the wafer can be salvaged, then at 1170, feedback information may be generated, with such feedback information operable to affect the RTA process of 1130. For example, the feedback information may cause the temperature at which the RTA of 1130 is performed to be decreased. Thus, at 1180, the feedback information is employed to control the RTA process, and the wafer is further processed as control returns to 1130.

FIG. 12 is a flow diagram illustrating another example methodology for carrying out the present invention. At step 1200, general initializations are performed. Such initializations can include, but are not limited to, allocating memory, establishing pointers, establishing data communications, initializing variables and instantiating objects. At 1220, a wafer is input to the process and at 1230 RTA is performed on the wafer of 1220. It is to be appreciated by one skilled in the art that RTA techniques including, but not limited to, adiabatic and isothermal RTA may employed in accordance with the present invention. At 1240 sheet resistivity measurements are taken from the wafer upon which RTA was performed in 1230. For example, potential gradient, current and current density measurements can be taken at one or more locations on the wafer, with such measurements then being subjected to numerical and/or statistical analysis. At 1250 a determination is made concerning whether the sheet resistivity measurements and/or numerical and/or statistical analysis performed on the sheet resistivity measurements indicate that an unacceptable sheet resistivity condition exists for one or more portions of the wafer upon which RTA was performed. If the determination at 1250 is NO, that sheet resistivity measurements are acceptable, then processing can conclude.

If the determination at 1250 is YES, then at 1260 one or more grid blocks for which unacceptable sheet resistivity measurements were generated are identified. At 1270 feedback information is generated. For example, feedback information operable to selectively control one or more heating elements associated with the one or more grid blocks for which unacceptable sheet resistivity measurements were generated can be generated. At 1280, a data store may be updated with information including, but not limited to, sheet resistivity measurements, the feedback information, RTA time parameters, RTA heat parameters, layer composition, wafer size, wafer composition, wafer supplier, processing stage data, RTA chamber data and sheet resistivity chamber data. Thus, the data store can subsequently be employed to facilitate machine learning that can adapt the RTA performed at 1230. Similarly, the data store can subsequently be employed to facilitate monitoring the method 1200 and for scheduling maintenance for one or more apparatus employed in performing the method 1200. Thus, at 1295, such monitoring can occur serially and/or substantially in parallel with other blocks in method 1200.

At 1290 the feedback information of 1270 is employed to selectively control one or more RTA conditions (e.g., time, temperature, heating method) and one or more RTA components (e.g., heating element). Processing then returns to 1230. It is to be appreciated by one skilled in the art, that the wafer of 1220 may be processed once, and/or may be subsequently reprocessed, in accordance with the present invention. By way of illustration, in one example aspect of the present invention, a first wafer may be input at 1220, have RTA performed upon it at 1230 and then be removed from the system after sheet resistivity measurements are taken. Such sheet resistivity measurements may be employed in adapting RTA for subsequent wafers. But by way of further illustration, a second wafer may be input at 1220, have RTA performed upon it at 1230 and then, based on the acceptability of sheet resistivity measurements taken from the wafer be reprocessed at 1230. It is to be further appreciated by one skilled in the art that the second wafer may first be subjected to one form of RTA (e.g., isothermal RTA) and then subsequently subjected to a different form of RTA (e.g., adiabatic RTA).

What has been described above includes examples of the present invention. It is, of course, not possible to describe every conceivable combination of components or methodologies for purposes of describing the present invention, but one of ordinary skill in the art may recognize that many further combinations and permutations of the present invention are possible. Accordingly, the present invention is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a traditional word in a claim.

What is claimed is:

1. A system for analyzing sheet resistivity of a silicide layer on a wafer and for controlling rapid thermal annealing (PTA) of the silicide layer comprising:
   one or more RTA components that perform RTA on the silicide layer;
   one or more sheet resistivity analyzing components that analyze the sheet resistivity of one or more portions of the silicide layer upon which the RTA components can perform RTA; and
   a feedback generator that accepts sheet resistivity data from the analyzing component and produces feedback information operable to control the one or more RTA components.

2. The system of claim 1, wherein the silicide is one of $TiSi_2$ and NiSi.

3. The system of claim 1, the feedback generator is operable to maintain and/or change the heating time for one or more RTA components.

4. The system of claim 1, the feedback generator is operable to maintain and/or change the heating temperature for one or more RTA components.

5. The system of claim 1, the feedback generator is operable to maintain and/or change the heating time and the heating temperature for one or more RTA components.

6. The system of claim 1, further comprising a data store that stores a first information associated with monitoring sheet resistivity and controlling RTA.

7. The system of claim 6, the first information includes at least one of sheet resistivity measurements, the feedback information, RTA time parameters, RTA heat parameters, layer composition, wafer size, wafer composition, wafer supplier, processing stage data, RTA chamber data and sheet resistivity chamber data.

8. The system of claim 6, further comprising a monitoring application that analyzes the feedback information and examines the first information stored in the data store and produces reporting information associated with at least one of the RTA components, the sheet resistivity analyzing components, the feedback generator and the data store.

9. The system of claim 8, the monitoring application schedules maintenance for at least one of the RTA components, the sheet resistivity analyzing components, the feedback generator and the data store.

10. The system of claim 1, the one or more RTA components and the one or more sheet resistivity components are located in the same physical apparatus.

11. The system of claim 10, the feedback generator is operable to maintain and/or change the heating time for one or more RTA components.

12. The system of claim 10, the feedback generator is operable to maintain and/or change the heating time and the heating temperature for one or more RTA components.

13. The system of claim 10, further comprising a data store that stores first information associated with monitoring sheet resistivity and controlling RTA.

14. The system of claim 13, the first information includes at least one of sheet resistivity measurements, the feedback information, RTA time parameters, RTA heat parameters layer composition, wafer size, wafer composition, wafer supplier, processing stage data, RTA chamber data and sheet resistivity chamber data.

15. The system of claim 13, further comprising a monitoring application that analyzes the feedback information and examines the first information stored in the data store and produces reporting information associated with at least one of the RTA components, the sheet resistivity analyzing components, the feedback generator and the data store.

16. The system of claim 15, the monitoring application schedules maintenance for at least one of the RTA components, the sheet resistivity analyzing components, the feedback generator and the data store.

17. The system of claim 1, the feedback generator is operable to maintain and/or change the beating temperature for one or more RTA components.

18. The system of claim 1, the wafer is mapped into a plurality of grid blocks, the one or more sheet resistivity analysis components make a determination of sheet resistivity at a grid block, and the one or more RTA components are selectively controllable to perform RTA at a grid block.

19. A method for regulating layer formation, comprising:
   defining a layer as one or more portions;
   performing rapid thermal annealing on one or more of the portions;
   measuring sheet resistivity in one or more of the portions;
   analyzing the sheet resistivity measurements to determine the acceptability of the sheet resistivity at one or more of the portions;
   generating feedback information, based at least in part on the sheet resistivity measurements, the feedback information operable to control one or more RTA components, the RTA components corresponding to a respective portion;
   controlling one or more RTA components to regulate RTA at one or more portion;
   storing at least one of the sheet resistivity measurements, the feedback information, RTA time parameters, RTA heat parameters, layer composition, wafer size, wafer composition, wafer supplier, processing stage data, RTA chamber data and sheet resistivity chamber data in a data store; and
   monitoring at least one of the sheet resistivity measurements, the feedback information, RTA time parameters, RTA heat parameters, layer composition, wafer size, wafer composition, wafer supplier, processing stage data, RTA chamber data and sheet resistivity chamber data and producing at least one of a productivity report, an error report and a maintenance schedule.

20. The method of claim 19, further comprising performing machine learning based, at least in part, on data stored in the data store, the machine learning capable of adapting one or more parameters associated with performing RTA on one or more of the portions.

21. A system for regulating layer formation on a silicide wafer, comprising:
   sensing means for sensing electrical properties of a silicide layer;
   rapid thermal processing means for heating a silicide layer; and
   controlling means for selectively controlling the rapid thermal processing means so as to regulate silicide layer formation.

22. A data packet transmittable between two or more processes, the data packet containing information related to sheet resistivity measurements, and feedback information operable to control one or more RTA components.

* * * * *